United States Patent
Yamauchi et al.

(10) Patent No.: US 7,893,770 B2
(45) Date of Patent: Feb. 22, 2011

(54) POWER AMPLIFICATION DEVICE

(75) Inventors: Kazuhisa Yamauchi, Tokyo (JP); Yuji Sakai, Tokyo (JP); Koichi Fujisaki, Tokyo (JP); Akira Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 28 days.

(21) Appl. No.: 12/518,664

(22) PCT Filed: Dec. 5, 2007

(86) PCT No.: PCT/JP2007/073504

§ 371 (c)(1),
(2), (4) Date: Jun. 11, 2009

(87) PCT Pub. No.: WO2008/075561

PCT Pub. Date: Jun. 26, 2008

(65) Prior Publication Data

US 2010/0079210 A1      Apr. 1, 2010

(30) Foreign Application Priority Data

Dec. 19, 2006   (JP) .............................. 2006-341476

(51) Int. Cl.
*H03F 3/68* (2006.01)

(52) U.S. Cl. .................... 330/295; 330/124 R

(58) Field of Classification Search ................ 330/295, 330/145 R, 84, 126
See application file for complete search history.

(56) References Cited

U.S. PATENT DOCUMENTS

| | | | |
|---|---|---|---|
| 5,757,229 A * | 5/1998 | Mitzlaff | .................. 330/124 R |
| 5,886,575 A | 3/1999 | Long | |
| 6,853,245 B2 | 2/2005 | Kim et al. | |
| 7,116,946 B2 | 10/2006 | Tanabe et al. | |
| 7,345,535 B2 * | 3/2008 | Kwon et al. | ............. 330/124 R |
| 7,385,445 B2 * | 6/2008 | Wright | .......................... 330/51 |
| 2007/0057722 A1 * | 3/2007 | Kwon et al. | ................... 330/53 |
| 2009/0045877 A1 * | 2/2009 | Wang et al. | .................. 330/295 |

FOREIGN PATENT DOCUMENTS

| JP | 2001 518731 | 10/2001 |
|---|---|---|
| JP | 2004 96729 | 3/2004 |
| JP | 2004 173231 | 6/2004 |
| JP | 2004 173249 | 6/2004 |

* cited by examiner

*Primary Examiner*—Henry K Choe
(74) *Attorney, Agent, or Firm*—Oblon, Spivak, McClelland, Maier & Neustadt, L.L.P.

(57) ABSTRACT

Provided is a power amplification device including: a DC power supply that outputs a drain voltage; a Doherty amplifier including a carrier amplifier and a peak amplifier, which are connected in parallel, and amplifies an RF signal; a voltage control circuit that outputs a first instruction to output a low voltage when an output power is equal to or lower than a given value, and outputs a second instruction to output a high voltage when the output power is larger than the given value; and a voltage converter circuit that converts the drain voltage to a voltage lower than the drain voltage and applies the converted voltage to drain terminals of the carrier amplifier and the peak amplifier according to the first instruction, and applies the drain voltage directly to the drain terminals of the carrier amplifier and the peak amplifier according to the second instruction.

2 Claims, 10 Drawing Sheets

POWER AMPLIFICATION DEVICE

TECHNICAL FIELD

The present invention relates to a power amplification device that is used for a radio communication device such as a cellular phone in a terrestrially-based cellular communication or a communication terminal device in a satellite communication, and is required to provide a higher efficiency.

BACKGROUND ART

The conventional power amplification device with a high efficiency includes a Doherty amplifier that combines a carrier amplifier with a peak amplifier (for example, refer to Non-Patent Document 1). The carrier amplifier is used to ensure linearity when an input signal is smaller (hereinafter, referred to as "at the time of the smaller signal"), and the peak amplifier is used to ensure a saturated electric power when the input signal is larger (hereinafter, referred to as "at the time of the larger signal"). The input signal that has been input to the Doherty amplifier is divided into two signals one of which is input to the carrier amplifier, and another of which is input to the peak amplifier. The carrier amplifier is normally biased from class A to class AB or to class B, and therefore executes amplification and output irrespective of the level of the input signal. The peak amplifier is normally biased to class C, and therefore becomes in a non-operating state at the time of the smaller signal and becomes in an operating state at the time of the larger signal to amplify and output the signal. That is, at the time of the smaller signal, only the carrier amplifier operates, and hence the highly efficient operation is obtained, and at the time of the larger signal, the outputs of the carrier amplifier and the peak amplifier are combined together, and hence a highly saturated electric power is ensured.

Non-Patent Document 1: Masatoshi Nakayama, Tadashi Takagi, "Techniques for Low Distortion and High Efficiency Power Amplifiers", MW E2004 Microwave Workshops Digest. P575-584

DISCLOSURE OF THE INVENTION

Problem to be Solved by the Invention

However, even the power amplification device using the Doherty amplifier, which are considered to be high in efficiency suffers from such a problem that the power efficiency at the time of the smaller signal is greatly deteriorated as compared with the efficiency at the time of the larger signal. In particular, in recent years, there are many examples in which a mobile communication terminal device such as a cellular phone employs a communication system used in a wide output power range, and an improvement in the power efficiency at the time of the smaller signal is one of the issues.

The present invention has been made to solve the above-mentioned problem, and an object of the present invention is to obtain a power amplification device that is used for a radio communication device such as a cellular phone in a terrestrially-based cellular communication, or a communication terminal device in a satellite communication, and is high in the power efficiency even at the time of the smaller signal.

Means for Solving the Problem

A power amplification device according to the present invention includes: a DC power supply that outputs a first drain voltage; a Doherty amplifier including a carrier amplifier and a peak amplifier, which are connected in parallel, and amplifies an RF signal; a voltage control circuit that outputs a first instruction to output a low voltage when an output power is equal to or lower than a given value, and outputs a second instruction to output a high voltage when the output power is larger than the given value; and a voltage converter circuit that applies a second drain voltage obtained by subjecting the first drain voltage to voltage conversion, or the first drain voltage to drain terminals of the carrier amplifier and the peak amplifier according to the first instruction, and applies the first drain voltage or the second drain voltage obtained by subjecting the first drain voltage to voltage conversion to the drain terminals of the carrier amplifier and the peak amplifier according to the second instruction.

Effect of the Invention

The power amplification device according to the present invention applies a lower voltage to a drain terminal when an output power is equal to or lower than a given value, and applies a higher voltage to the drain terminal when the output power is higher than the given value, thereby resulting in such an advantage that the power efficiency can be improved by operating at the low voltage at the time of the smaller signal.

BEST MODE FOR CARRYING OUT THE INVENTION

A first embodiment to a fifth embodiment of the present invention are described below.

First Embodiment

Figure 1:
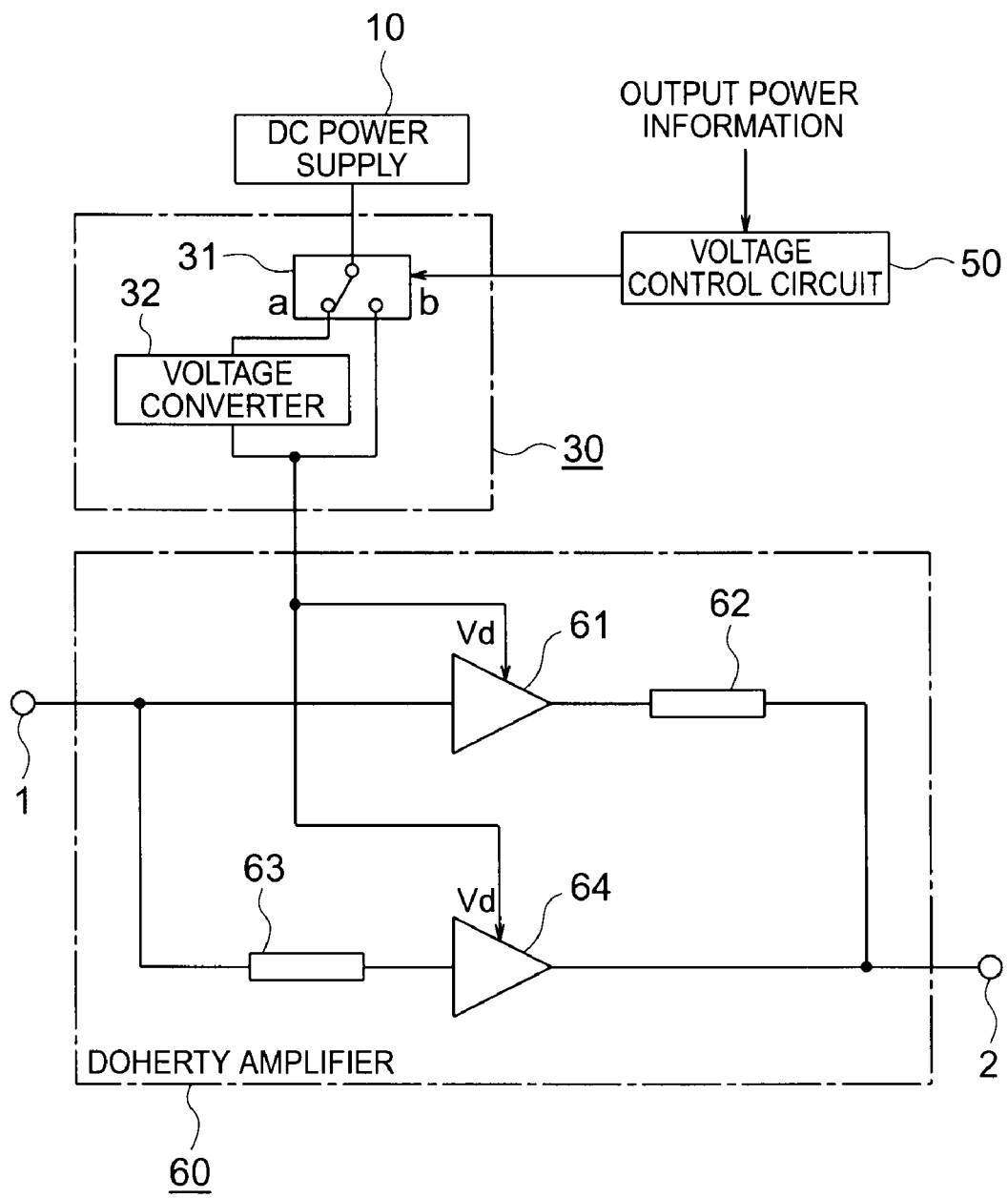
FIG. 1 A diagram illustrating a configuration of a power amplification device according to a first embodiment of the present invention.

A power amplification device according to a first embodiment of the present invention is described with reference to FIGS. 1 to 6. FIG. 1 is a diagram illustrating a configuration of the power amplification device according to the first embodiment of the present invention. In the following description, the same symbols represent identical or corresponding parts in the respective figures.

Referring to FIG. 1, the power amplification device according to the first embodiment of the present invention includes a DC power supply 10 that outputs a drain voltage Vd, a voltage converter circuit 30 that variably outputs a voltage from the DC power supply 10, a voltage control circuit 50 that controls the voltage converter circuit 30 on the basis of output power information, and a Doherty amplifier 60 that amplifies an RF input signal from an RF input terminal 1 to output the amplified signal from an RF output terminal 2.

Further, in FIG. 1, the voltage converter circuit 30 is provided with a switch 31 that changes over an output direction of the DC power supply 10, and a voltage converter 32 that converts an input voltage of the DC power supply 10 into a voltage lower than the input voltage. The switch 31 changes over between a path that allows the output voltage of the DC power supply 10 to be subjected to voltage conversion by means of the voltage converter 32 and to be then output to the Doherty amplifier 60, and a path that allows the output voltage of the DC power supply 10 to be output to the Doherty amplifier 60 as it is.

The voltage converter circuit 30 is controlled by the voltage control circuit 50 so as to output a higher voltage when the output power based on the output power information is higher, and a lower voltage when the output power is lower.

Further, in FIG. 1, the Doherty amplifier 60 includes a carrier amplifier 61, a ¼ wavelength line 62 disposed on an output side of the carrier amplifier 61, a ¼ wavelength line 63 disposed on an input side of the peak amplifier to be described later, and a peak amplifier 64. The output voltage of the DC power supply 10 is applied to the carrier amplifier 61 and the peak amplifier 64 within the Doherty amplifier 60 through the voltage converter circuit 30.

Figure 2:
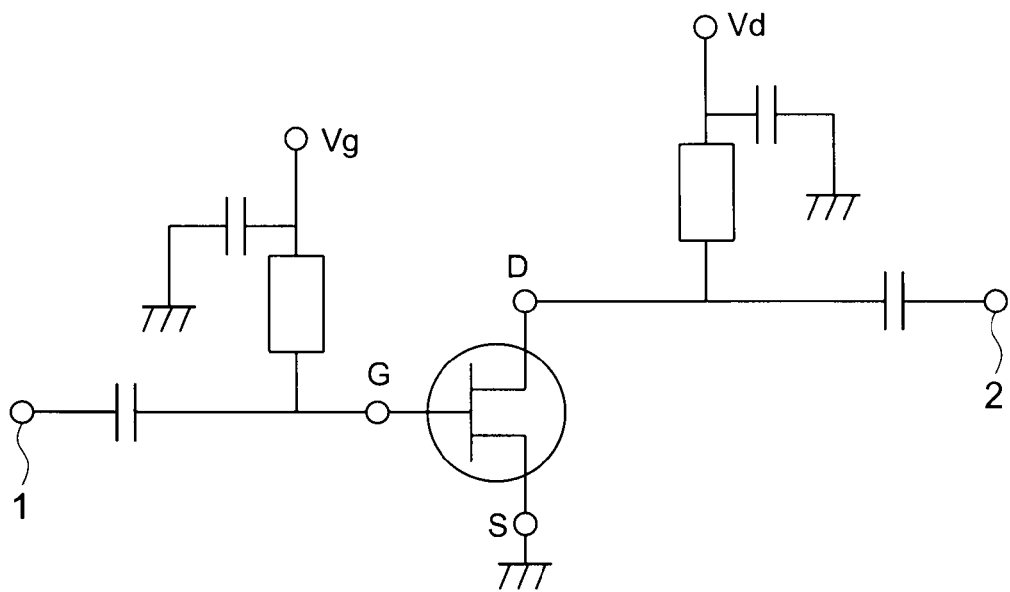
FIG. 2 A diagram illustrating a circuit configuration of a carrier amplifier of a Doherty amplifier in the power amplification device according to the first embodiment of the present invention.

FIG. 2 is a diagram illustrating a circuit configuration of the carrier amplifier of the Doherty amplifier in the power amplification device according to the first embodiment of the present invention.

The carrier amplifier 61 is formed of a field effect transistor (FET) or a bipolar transistor, and the circuit configuration of the FET is illustrated in FIG. 2. The same is applied to the circuit configuration of the peak amplifier 64. A source terminal S of the FET is grounded, the RF input terminal 1 is connected to a gate terminal G thereof, and the gate terminal G is biased by a gate voltage Vg. A drain terminal D thereof is connected to the RF output terminal 2, and a drain voltage Vd is applied to the drain terminal D.

In this example, bias setting for the FET and the like are described. The same is applied to a case in which the bipolar transistor is used. That is, an emitter terminal E of the bipolar transistor is grounded, a base terminal B thereof is connected to the RF input terminal 1, and a collector terminal C is connected to the RF output terminal 2. Then, the bias setting of the base terminal B enables the carrier amplifier 61 to operate in class A (or to operate in class AB or class B), and the peak amplifier 64 to operate in class C. In this case, the collector terminal C of the bipolar transistor corresponds to the drain terminal D of the FET. Hereinafter, a case of the FET is described. The voltage application to the collector terminal C of the bipolar transistor can be conducted in the same manner as the voltage application to the drain terminal D of the FET. That is, entirely herein, in the carrier amplifier 61 and the peak amplifier 64, the source terminal S, the gate terminal G, and the drain terminal D of the FET can be replaced with the emitter terminal E, the base terminal B, and the collector terminal C of the bipolar transistor, respectively in the case of the bipolar transistor.

Subsequently, the operation of the power amplification device according to the first embodiment of the present invention is described with reference to the drawings.

Figure 3:
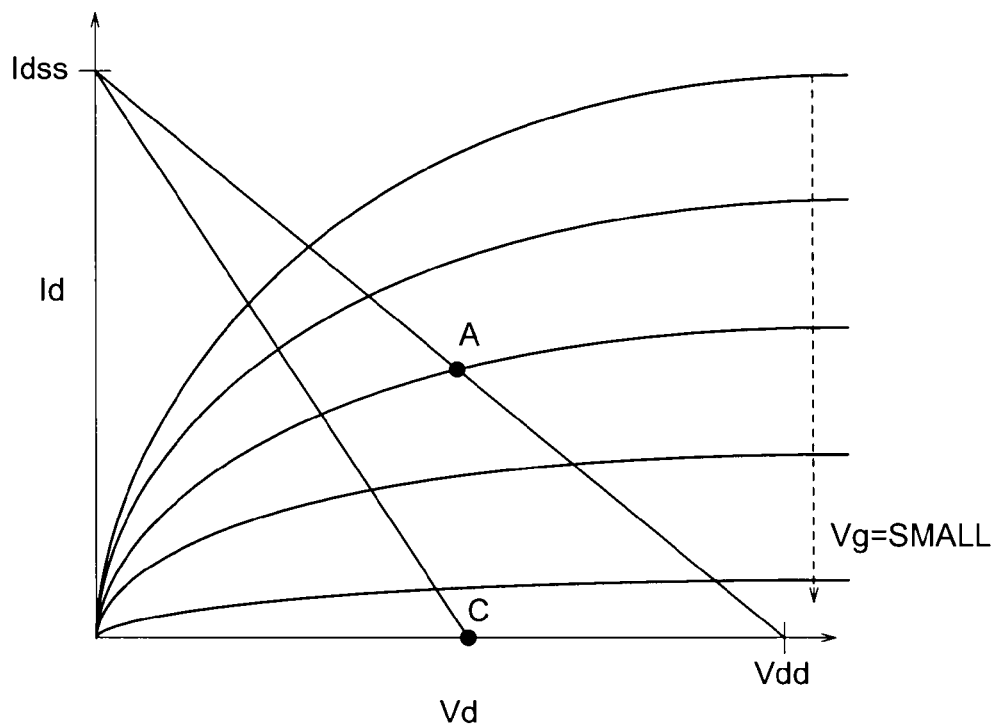
FIG. 3 A diagram illustrating setting of operating points of an FET in the power amplification device according to the first embodiment of the present invention.
Figure 4:
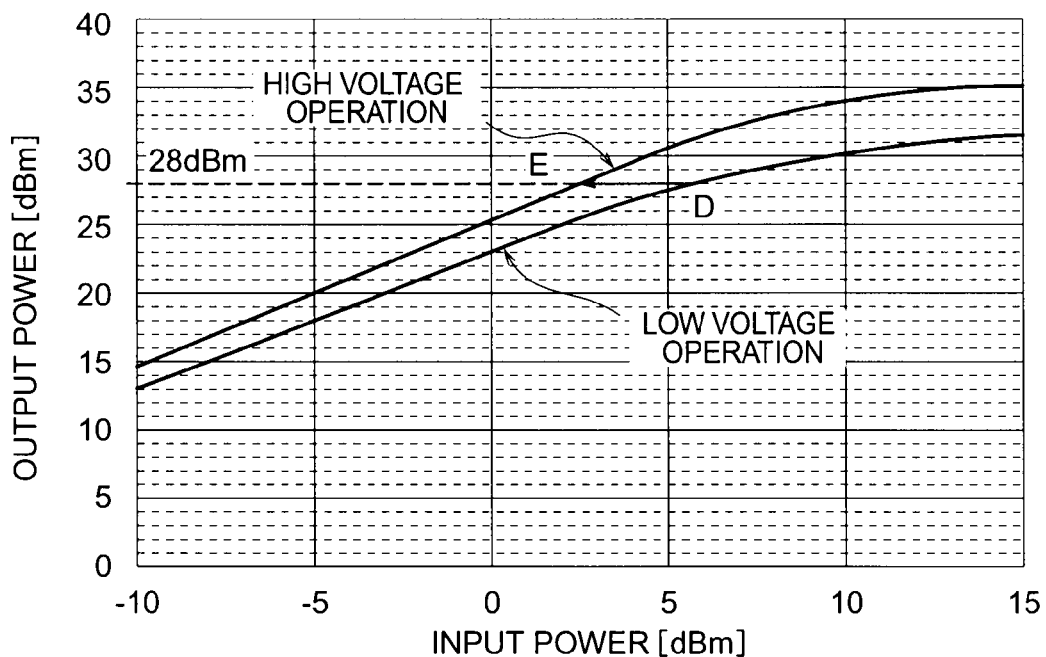
FIG. 4 A graph illustrating a relationship between an input power and an output power in the cases of a low voltage operation and a high voltage operation of the power amplification device according to the first embodiment of the present invention.
Figure 5:
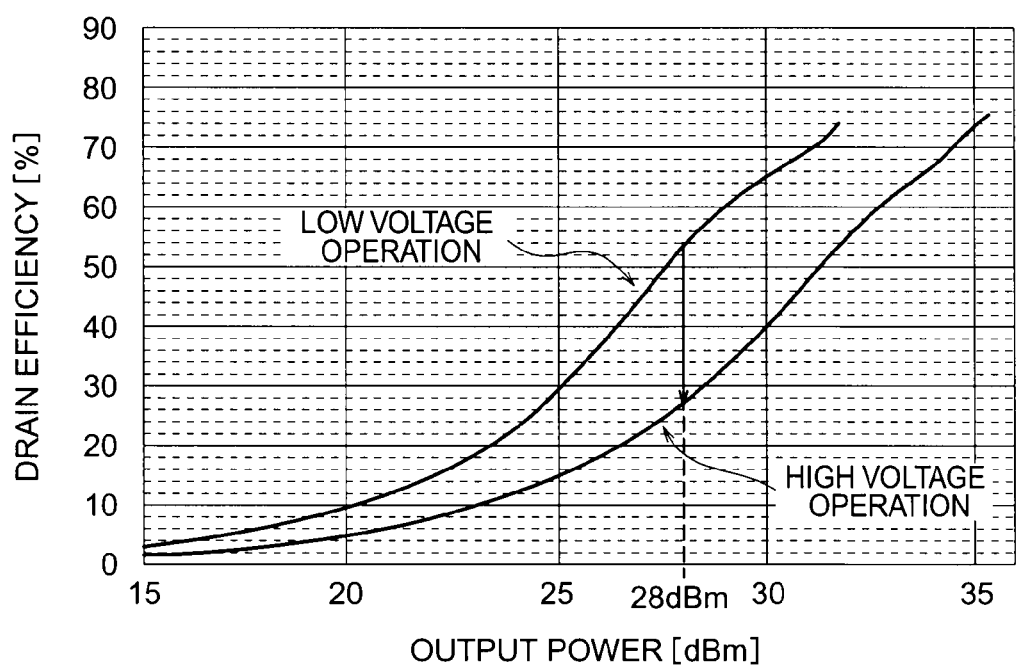
FIG. 5 A graph illustrating a relationship between the output power and a drain efficiency in the cases of the low voltage operation and the high voltage operation of the power amplification device according to the first embodiment of the present invention.
Figure 6:
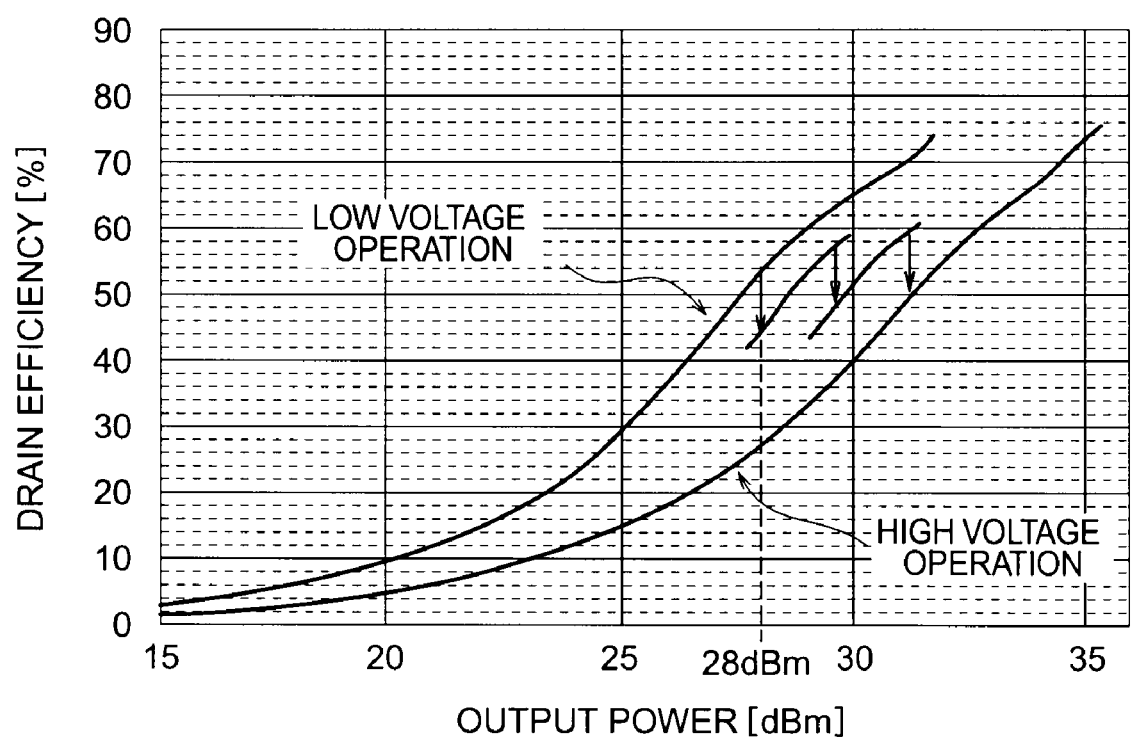
FIG. 6 A graph illustrating a relationship between the output power and the drain efficiency in a case where an applied voltage to drain terminals of the carrier amplifier and a peak amplifier changes over to three steps or more.

FIG. 3 is a diagram illustrating setting of operating points of the FET in the power amplification device according to the first embodiment of the present invention. Further, FIG. 4 is a graph illustrating a relationship between an input power and an output power in the cases of a low voltage operation and a high voltage operation of the power amplification device according to the first embodiment of the present invention. FIG. 5 is a graph illustrating a relationship between the output power and a drain efficiency in the cases of the low voltage operation and the high voltage operation of the power amplification device according to the first embodiment of the present invention. Further, FIG. 6 is a graph illustrating a relationship between the output power and the drain efficiency in a case where an applied voltage to the drain terminals of the carrier amplifier and the peak amplifier changes over to three steps or more.

First, the operation of the Doherty amplifier 60 is described. The RF signal input from the RF input terminal 1 is divided into two signals one of which is input to the carrier amplifier 61 and another of which is input to the peak amplifier 64. The carrier amplifier 61 is normally biased from class A to class AB or to class B, and therefore executes amplification and output irrespective of the level of the input RF signal. The peak amplifier 64 is normally biased to class C, and therefore becomes in a non-operating state at the time of the smaller signal and becomes in an operating state at the time of the larger signal to amplify and output the signal.

The drain voltages Vd of the carrier amplifier 61 and the peak amplifier 64 are set by the DC power supply 10 and the voltage converter circuit 30. FIG. 3 is a schematic diagram illustrating setting of operating points of the FET, and the gate voltage Vg is set so that the carrier amplifier 61 reaches the operating point at a point A of FIG. 3, and the peak amplifier 64 reaches the operating point at a point C of FIG. 3. As illustrated in FIG. 3, the operating point of class A is at a position where a drain current Id is about Idss/2, and the operating point of class C is at a position where the drain current Id is substantially 0. In this example, Idss represents a drain current value when the gate voltage is set to 0. The operating points called class AB and class B are positioned between the operating points A and C. The carrier amplifier 61 is set to the point A by setting of the gate voltage Vg to provide the operation in class A, and the peak amplifier 64 is set to the point C by setting of the gate voltage Vg to provide the operation in class C.

Referring to FIG. 1, output power information is input to the voltage control circuit 50, and the voltage control circuit 50 controls the voltage converter circuit 30 on the basis of the output power information. The output power information is information representative of the output power of the RF signal output by the power amplification device. When the output power is equal to or lower than a given value, the voltage control circuit 50 gives an instruction to connect the switch 31 to a side "a" (outputs a first instruction). The voltage converter 32 converts an input voltage of the DC power supply 10 into a voltage lower than the input voltage, and applies the converted voltage to the drain terminals D of the carrier amplifier 61 and the peak amplifier 64 to operate those amplifiers 61 and 64 at a low voltage (hereinafter, referred to as "low voltage operation").

On the other hand, when the output power is larger than the given value, the voltage control circuit 50 gives an instruction to connect the switch 31 to a side "b" (outputs a second instruction). The voltage converter circuit 30 applies the voltage of the DC power supply 10 to the drain terminals D of the carrier amplifier 61 and the peak amplifier 64 to operate those amplifiers 61 and 64 at a high voltage (hereinafter, referred to as "high voltage operation").

A relationship between an input power and an output power in the cases of the low voltage operation and the high voltage operation is illustrated in FIG. 4, and a relationship between the output power and a drain efficiency in those cases is illustrated in FIG. 5. A drain efficiency Ed is represented by Ed=100×(Pout/Pdc)[%] assuming that the output power is Pout, and the power consumption of the DC power supply 10 is Pdc. As illustrated in FIG. 4, in the case of the low voltage operation, the output power is lower than that in the case of the high voltage operation, but as illustrated in FIG. 5, the drain efficiency is higher in the low voltage operation. With the use of those characteristics, the operation is conducted at the low voltage when the output power is equal to or lower than the given value, and the operation is conducted at the high voltage when the output power is higher than the given value.

For example, when the maximum output power specification of the power amplification device is set to 34 dBm, the operation is conducted with 28 dBm which is −6 dB value of the maximum output power being as a given value. In this case, when the output power is equal to or lower than 28 dBm being the given value, the low voltage converted by the voltage converter 32 is applied to the drain terminals D of the carrier amplifier 61 and the peak amplifier 64, thereby allowing the carrier amplifier 61 and the peak amplifier 64 to operate at the low voltage. Thus, it is possible to obtain the high drain efficiency in the low output state.

When the output power is larger than 28 dBm being the given value, the voltage of the DC power supply 10 is applied to the drain terminals D of the carrier amplifier 61 and the peak amplifier 64, thereby allowing the carrier amplifier 61 and the peak amplifier 64 to operate at the high voltage. Thus, it is possible to ensure the highly saturated power in the high output state.

Arrows illustrated in FIGS. 4 and 5 represent the shift of the operating points from the low output state to the high output state with a boundary of the output power 28 dBm, and conversely, the shift of the operating points from the high output state to the low output state is opposite to the arrows. As illustrated in FIG. 4, in order to make the output power at the output power 28 dBm continuous, the input power at the time of the high voltage operation is offset with respect to the input power at the time of the low voltage operation by the quantity indicated by the arrow (from D to E) of FIG. 4. The applied voltage to the drain terminal D is changed with respect to the thus set given value of the output power between a case where the output power is equal to or lower than the given value, and a case where the output voltage is larger than the given value. However, for the setting of the given value, the minus several dB value of the maximum output power can arbitrarily be set, and the given value is determined mainly on the basis of the transmission power range (minimum value and maximum value) specification of the power amplification device.

In the above-mentioned description, the configuration in which the voltage converter 32 converts the output voltage of the DC power supply 10 into the lower voltage has been described. Alternatively, the configuration can be replaced with a booster type in which the voltage converter 32 converts the output voltage of the DC power supply 10 into a higher voltage. In this case, the voltage output by the DC power supply 10 becomes a low voltage, and the voltage control circuit 50 instructs the switch 31 to connect to the side b at the time of the low voltage operation, and to connect to the side a at the time of the high voltage operation.

Further, the applied voltage to the drain terminals of the carrier amplifier 61 and the peak amplifier 64 changes over to three steps or more (at least three drain voltages different in voltage value), thereby making it possible to further improve the efficiency. For example, as illustrated in FIG. 6, when the output power is larger than 28 dBm, and the drain applied voltage is set to multiple steps, the power efficiency is further improved. In this way, the drain applied voltage can be set to three steps or more so as to further enhance the power efficiency. To achieve this, it is conceivable to adopt a method in which the voltage converter 32 is of an output voltage variable type and controlled by the voltage control circuit 50, a method in which two or more voltage converters 32 are provided and switched over under the control of the voltage control circuit 50, or the like. That is, the voltage control circuit 50 instructs the voltage converter circuit 30 about a voltage variably output from the voltage converter circuit 30 on the basis of the magnitude relation between two or more given values (at least two given values different in value) and the output power (at least three instructions). The voltage converter circuit 30 outputs at least three drain voltages different in voltage value on the basis of the at least three instructions.

According to the first embodiment of the present invention, the lower voltage is applied to the drain terminal D or the collector terminal C when the output power is equal to or lower than the given value, and the higher voltage is applied to the drain terminal D or the collector terminal C when the output power is larger than the given value. As a result, the operation is conducted at the lower voltage at the time of the smaller signal, thereby making it possible to improve the power efficiency.

Second Embodiment

Figure 7:
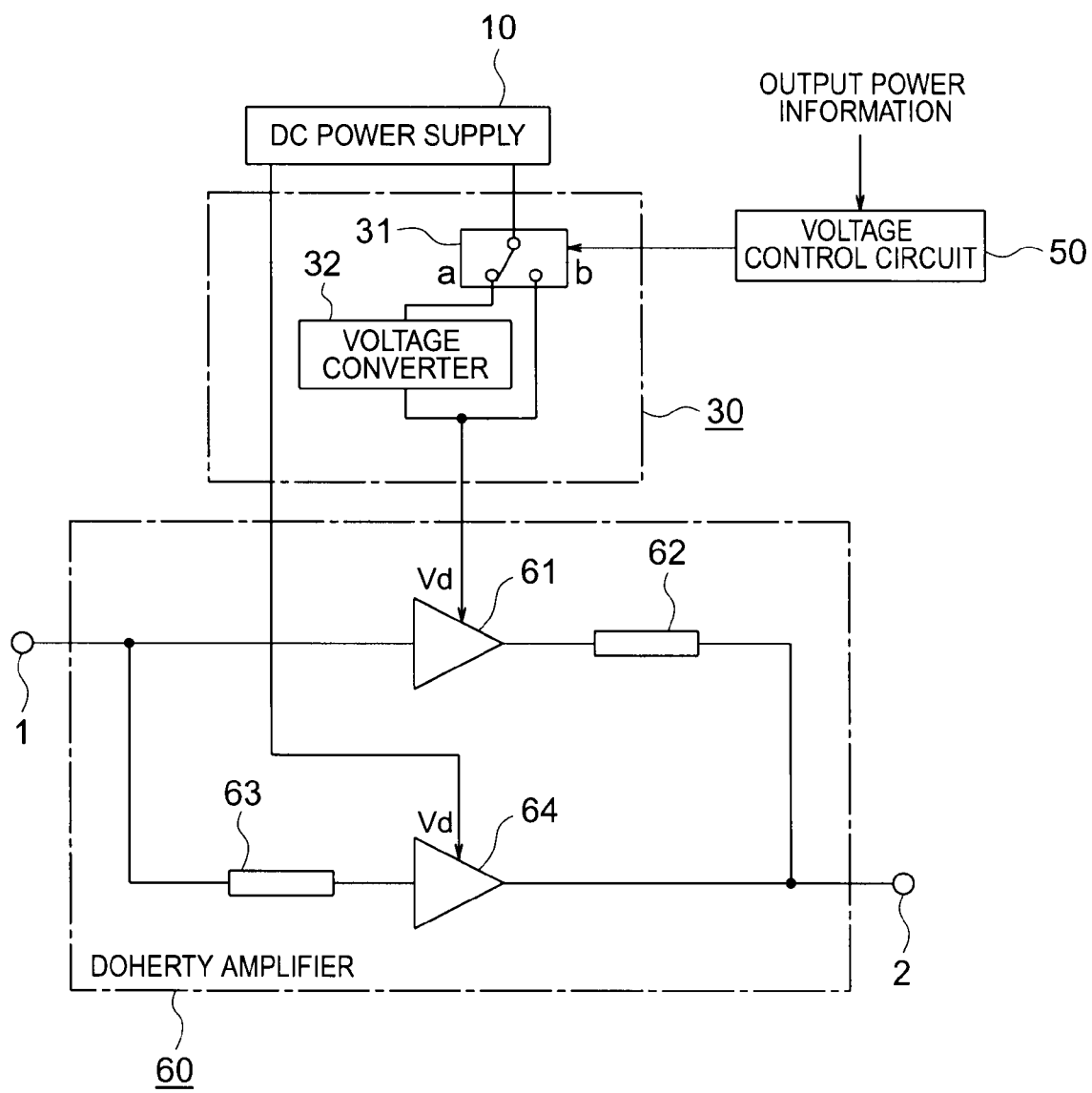
FIG. 7 A diagram illustrating a configuration of a power amplification device according to a second embodiment of the present invention.

A power amplification device according to a second embodiment of the present invention is described with reference to FIG. 7. FIG. 7 is a diagram illustrating a configuration of the power amplification device according to the second embodiment of the present invention.

Referring to FIG. 7, the configuration of the power amplification device according to the second embodiment of the present invention is different from that of the first embodiment in that the voltage to the drain terminal D of the carrier amplifier 61 changes over between the direction application from the DC power supply 10 and the variable application through the voltage converter 32 therefrom, and the output voltage of the DC power supply 10 is applied directly to the drain terminal D of the peak amplifier 64. Other configurations and operation are identical with those of the first embodiment.

Subsequently, a description is given of the operation of the power amplification device according to the second embodiment of the present invention with reference to the drawings.

On the basis of the output power information, when the output power is equal to or lower than the given value, the voltage control circuit 50 connects the switch 31 to the side a, converts the output voltage of the DC power supply 10 into the lower voltage by means of the voltage converter 32, and applies the converted voltage to the drain terminal D of the carrier amplifier 61. On the other hand, when the output power is larger than the given value, the voltage control circuit 50 connects the switch 32 to the side b, and applies the output voltage of the DC power supply 210 to the drain terminal D of the carrier amplifier 61.

The output voltage of the DC power supply 10 is applied directly to the drain terminal D of the peak amplifier 64.

In the power amplification device illustrated in FIG. 7, only the carrier amplifier 61 is made to operate at the low voltage, thereby making it possible to set the current capacity required for the voltage converter 32 to be smaller than (for example, to about half) the maximum current consumption of the Doherty amplifier 60. As a result, there are such advantage that the power consumption and the calorific value in the voltage converter 32 can be reduced, and that downsized and inexpensive parts can be used. The carrier amplifier 61 is made to operate at the low voltage and high voltage. As a result, the power efficiency of the carrier amplifier 61 at the time of the low voltage operation is improved, and a higher saturated power can be obtained by the carrier amplifier 61 and the peak amplifier 64 at the time of the high voltage operation.

Further, the applied voltage to the drain terminal D of the carrier amplifier 61 changes over to three steps or more (at least three drain voltages different in voltage value), thereby making it possible to further improve the power efficiency. For example, when the output power is larger than 28 dBm, and the drain applied voltage is set to multiple steps as in FIG. 6 in the first embodiment, the power efficiency is further improved. In this way, the drain applied voltage can be set to three steps or more, thereby enabling the efficiency to be further enhanced. To achieve this, it is conceivable to adopt a method in which the voltage converter 32 is of an output voltage variable type and controlled by the voltage control circuit 50, a method in which two or more voltage converters 32 are provided and switched over under the control of the voltage control circuit 50, or the like. That is, the voltage control circuit 50 instructs the voltage converter circuit 30 about a voltage variably output from the voltage converter circuit 30 on the basis of the magnitude relation between two or more given values (at least two given values different in value) and the output power (at least three instructions). The voltage converter circuit 30 outputs at least three drain voltages different in voltage value on the basis of the at least three instructions.

According to the second embodiment of the present invention, the lower voltage is applied to the drain terminal D or the collector terminal C when the output power is equal to or lower than the given value, and the higher voltage is applied to the drain terminal D or the collector terminal C when the output power is larger than the given value. As a result, the operation is conducted at the lower voltage at the time of the smaller signal, thereby making it possible to improve the power efficiency.

Third Embodiment

Figure 8:
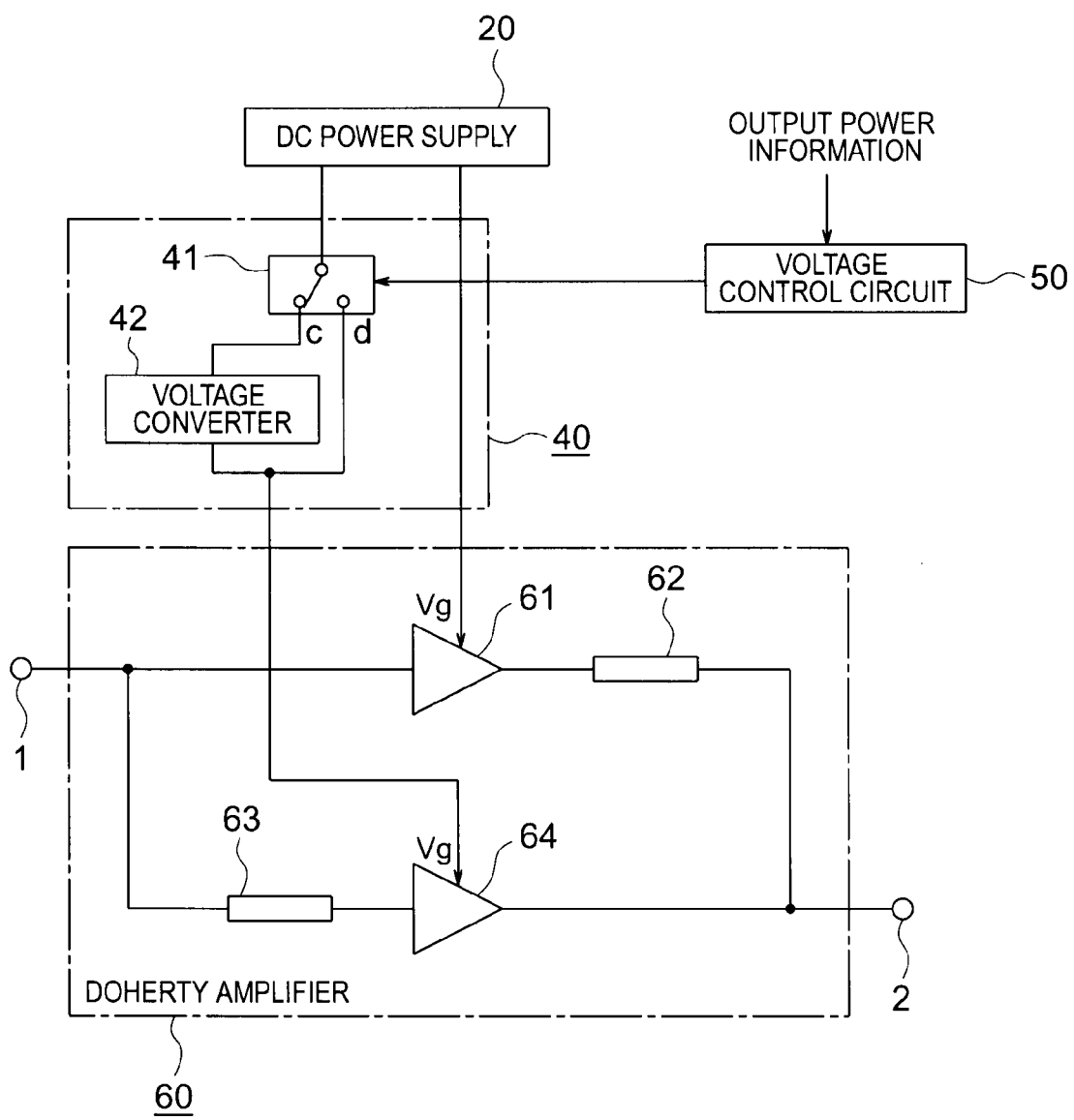
FIG. 8 A diagram illustrating a configuration of a power amplification device according to a third embodiment of the present invention.

A power amplification device according to a third embodiment of the present invention is described with reference to FIGS. 8 and 9. FIG. 8 is a diagram illustrating a configuration of the power amplification device according to the third embodiment of the present invention.

Referring to FIG. 8, the power amplification device according to the third embodiment of the present invention includes a DC power supply 20 that outputs a gate voltage Vg, a voltage converter circuit 40 that variably outputs a voltage from the DC power supply 20, a voltage control circuit 50 that controls the voltage converter circuit 40 on the basis of output power information, and a Doherty amplifier 60 that amplifies an RF input signal from an RF input terminal 1 to output the amplified signal from an RF output terminal 2.

Further, in FIG. 8, the voltage converter circuit 40 is provided with a switch 41 that changes over an output direction of the DC power supply 20, and a voltage converter 42 that converts an input voltage of the DC power supply 20 into a voltage lower than the input voltage. The switch 41 changes over between a path that allows the output voltage of the DC power supply 20 to be subjected to voltage conversion by means of the voltage converter 42 and to be then output to the gate terminal G of the peak amplifier 64, and a path that allows the output voltage of the DC power supply 20 to be output to the gate terminal G of the peak amplifier 64 as it is.

The output voltage of the DC power supply 20 is applied to the gate terminals G of the carrier amplifier 61 and the peak amplifier 64 within the Doherty amplifier 60 through the voltage converter circuit 40. The voltage converter circuit 40 is controlled by the voltage control circuit 50 so as to turn off the peak amplifier 64 when the output power based on the output power information is lower, and to operate the carrier amplifier 61 and the peak amplifier 64 when the output power is higher. Other configurations and the basic operation of the Doherty amplifier 60 are identical with those in the first embodiment.

Subsequently, the operation of the power amplification device according to the third embodiment of the present invention is described with reference to the drawings.

Figure 9:
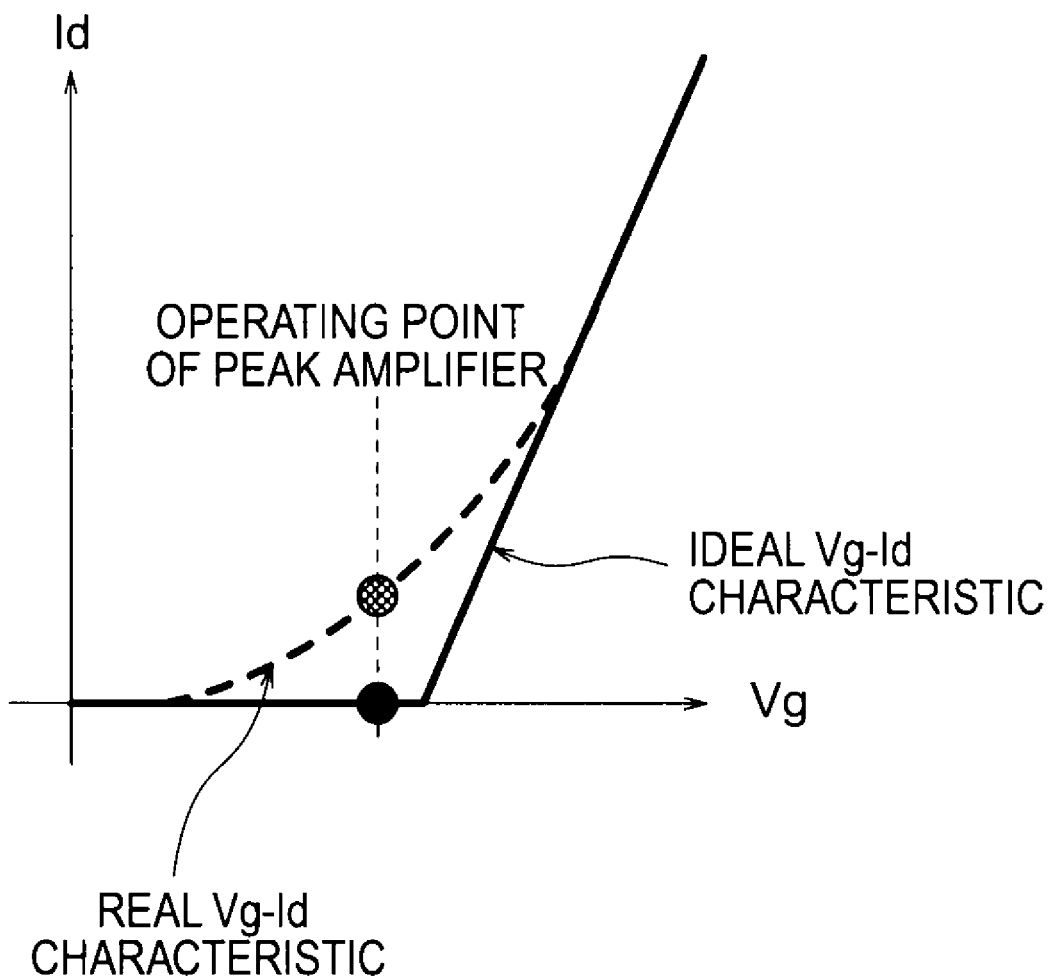
FIG. 9 A graph illustrating a gate voltage to drain current characteristic in the vicinity of a bias point of a peak amplifier in the power amplification device according to the third embodiment of the present invention.

FIG. 9 is a graph illustrating a gate voltage to drain current characteristic in the vicinity of a bias point of the peak amplifier in the power amplification device according to the third embodiment of the present invention.

In FIG. 8, the output power information is input to the voltage control circuit 50, and the voltage control circuit 50 controls the voltage converter circuit 40 on the basis of the output power information. The output power information is information representative of the output power of the RF signal output by the power amplification device.

An output voltage of the DC power supply 20 is applied directly to the gate terminal G of the carrier amplifier 61.

When the output power is equal to or lower than a given value, the voltage control circuit 50 gives an instruction to connect the switch 42 to a side c (outputs a first instruction). The voltage converter 42 converts the input voltage of the DC power supply 20 into a voltage lower than the input voltage, and applies the voltage to the gate terminal G of the peak amplifier 64 to completely turn off the peak amplifier 64 (hereinafter, referred to as "off-state").

On the other hand, when the output power is larger than the given value, the voltage control circuit 50 gives an instruction to connect the switch 41 to a side d (outputs the first instruction). The voltage converter circuit 40 applies the voltage of the DC power supply 20 to the gate terminal G of the peak amplifier 64, and puts the peak amplifier 64 into the normal class-C bias operation state (hereinafter, referred to as "class-C bias operation").

A relationship of the drain current with respect to the gate voltage of the FET is illustrated in FIG. 9. In theory, due to the fact that the peak amplifier 64 of the Doherty amplifier 60 is biased to class C, the peak amplifier 64 becomes in a non-operating state in a region where the output power is equal to or lower than a pinch off voltage being at the time of the smaller signal. However, in fact, the class-C bias has the characteristic that a current starts to flow in the vicinity of the pinch off voltage bit by bit, and that the drain current gradually increases according to an increase in the gate voltage, and hence the drain current is consumed even in a region where the peak amplifier 64 is in the off-state in theory. This current hardly contributes to the output power, and hence the power is consumed wastefully. The peak amplifier 64 is turned off when the output power is equal to or lower than the given value, and the peak amplifier 64 is operated by class-C bias when the output power is larger than the given value. As a result, in theory, in the region where the peak amplifier 64 is to be in the off-state, the power consumed by the peak amplifier 64 can be reduced, and the power efficiency can be improved.

According to the third embodiment of the present invention, the gate voltage or the base voltage which allows the peak amplifier 64 to be completely in the off-state is applied to the peak amplifier 64 when the output power is equal to or lower than the given value. As a result, the power consumed by the peak amplifier 64 because the peak amplifier 64 is not completely in the off-state in the region where the peak amplifier 64 is to be in the off-state in theory, can be reduced, thereby enabling the power efficiency to be improved.

Fourth Embodiment

Figure 10:
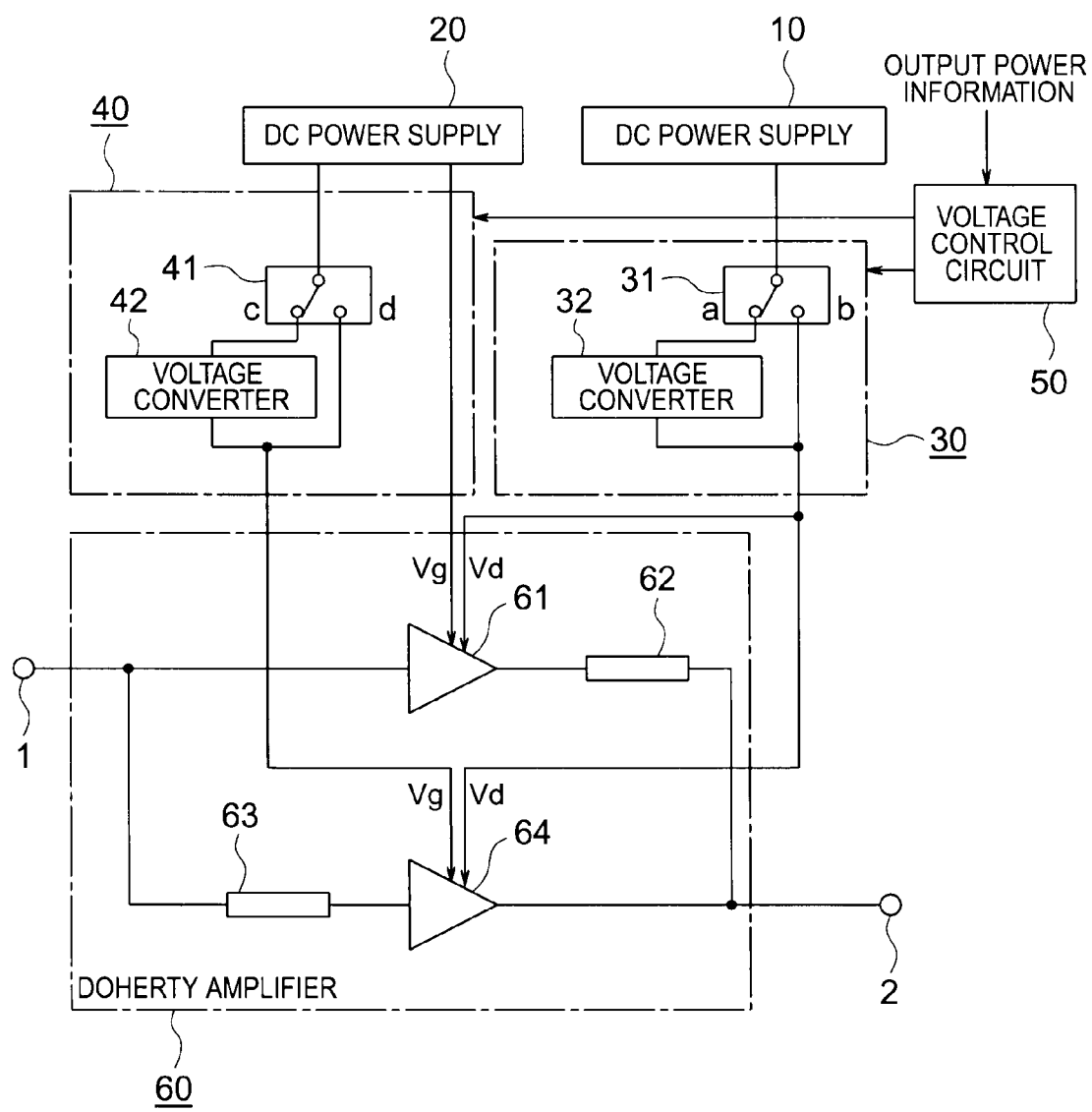
FIG. 10 A diagram illustrating a configuration of a power amplification device according to a fourth embodiment of the present invention.

A power amplification device according to a fourth embodiment of the present invention is described with reference to FIGS. 10 and 11. FIG. 10 is a diagram illustrating a configuration of the power amplification device according to the fourth embodiment of the present invention.

Referring to FIG. 10, the power amplification device according to the fourth embodiment of the present invention includes a DC power supply (first DC power supply) 10 that outputs a drain voltage Vd, a DC power supply (second DC power supply) 20 that outputs a gate voltage Vg, a voltage converter circuit (first voltage converter circuit) 30 that variably outputs a voltage from the DC power supply 10, a voltage converter circuit (second voltage converter circuit) 40 that variably outputs a voltage from the DC power supply 20, a voltage control circuit 50 that controls the voltage converter circuit 30 and the voltage converter circuit 40 on the basis of output power information, and a Doherty amplifier 60 that amplifies an RF input signal from an RF input terminal 1 to output the amplified signal from an RF output terminal 2.

In the voltage converter circuit 30, a switch 31 changes over between a path that allows the output voltage of the DC power supply 10 to be subjected to voltage conversion by means of the voltage converter 32 and then to be output to the carrier amplifier 61 and the peak amplifier 64, and a path that allows the output voltage of the DC power supply 10 to be output to the carrier amplifier 61 and the peak amplifier 64 without being subjected to voltage conversion. The output voltage of the DC power supply 10 is applied to the drain terminals D of the carrier amplifier 61 and the peak amplifier 64 within the Doherty amplifier 60 through the voltage converter circuit 30. The voltage converter circuit 30 is controlled by the voltage control circuit 50 so as to output the lower voltage when the output power based on the output power information is lower, and to output the higher voltage when the output power is higher.

Further, in the voltage converter circuit 40, a switch 41 changes over between a path that allows the output voltage of the DC power supply 10 to be subjected to voltage conversion by means of the voltage converter 42 and then to be output to the gate terminal G of the peak amplifier 64, and a path that allows the output voltage of the DC power supply 20 to be output to the gate terminal G of the peak amplifier 64 without being subjected to voltage conversion. The output voltage of the DC power supply 20 is applied to the gate terminals D of the carrier amplifier 61 and the peak amplifier 64 within the Doherty amplifier 60 through the voltage converter circuit 40. The voltage converter circuit 40 is controlled by the voltage control circuit 50 so as to turn off the peak amplifier 64 when the output power based on the output power information is lower, and to operate the carrier amplifier 61 and the peak amplifier 64 when the output power is higher. Other configurations and the basic operation of the Doherty amplifier 60 are identical with those in the first and third embodiments.

Subsequently, a description is given of the operation of the power amplification device according to the fourth embodiment of the present invention with reference to the drawings.

Figure 11:
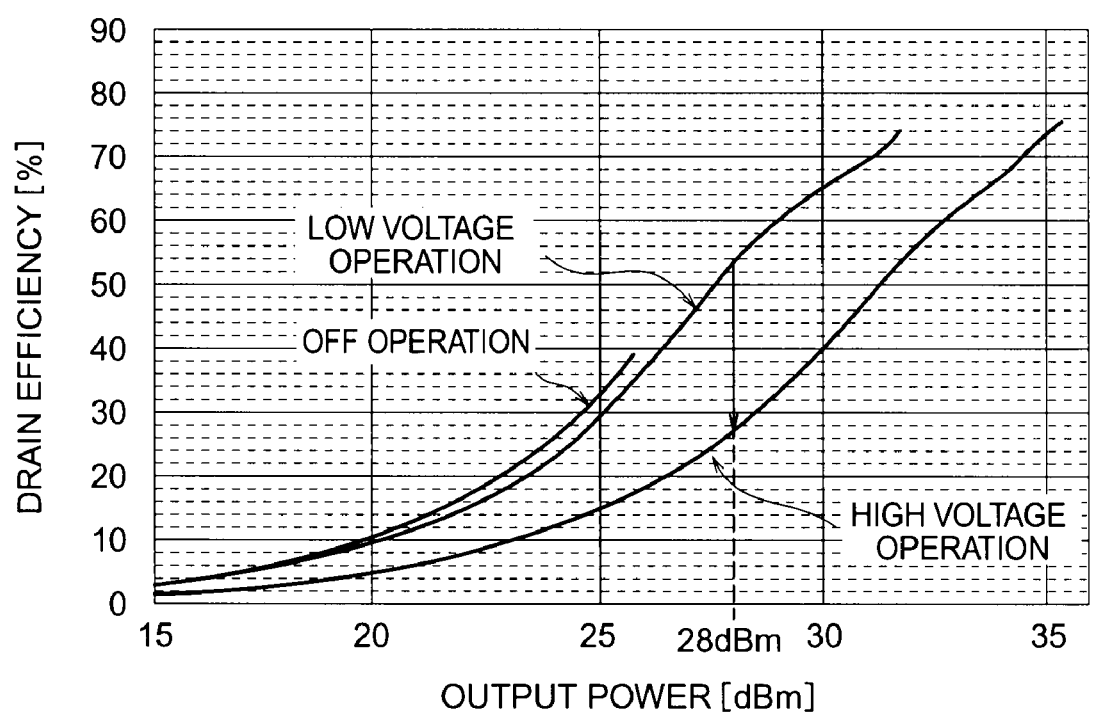
FIG. 11 A graph illustrating a relationship between an output power and a drain efficiency in the power amplification device according to the fourth embodiment of the present invention.

FIG. 11 is a graph illustrating a relationship between an output power and a drain efficiency in the power amplification device according to the fourth embodiment of the present invention.

Referring to FIG. 10, output power information is input to the voltage control circuit 50, and the voltage control circuit 50 controls the voltage converter circuit 30 and the voltage converter circuit 40 on the basis of the output power information. The output power information is information representative of the output power of the RF signal output by the power amplification device. When the output power is equal to or lower than a given value A (first given value), the voltage control circuit 50 gives an instruction to connect the switch 31 to the side "a" (outputs a first instruction). The voltage converter 32 converts an input voltage of the DC power supply 10 into a voltage lower than the input voltage, and applies the converted voltage to the drain terminals D of the carrier amplifier 61 and the peak amplifier 64 to operate those amplifiers 61 and 64 at a low voltage.

Further, when the output power is equal to or lower than a given value B (second given value), the voltage control circuit 50 gives an instruction to connect the switch 41 to the side "c" (outputs a third instruction). The voltage converter 42 converts an input voltage of the DC power supply 20 into a voltage lower than the input voltage, and applies the converted voltage to the gate terminal G of the peak amplifier 64 to completely turn off the peak amplifier 64.

On the other hand, when the output power is larger than the given value A, the voltage control circuit 50 gives an instruction to connect the switch 31 to the side b (outputs a second instruction). The voltage converter circuit 30 applies the voltage of the DC power supply 10 to the drain terminals D of the carrier amplifier 61 and the peak amplifier 64, and operates those amplifiers at the high voltage.

Further, when the output power is larger than the given value B, the voltage control circuit 50 gives an instruction to connect the switch 41 to the side d (outputs a fourth instruction). The voltage converter circuit 40 applies the voltage of the DC power supply 20 to the gate terminal G of the peak amplifier 64, and puts the peak amplifier 64 into a normal class-C bias operating state. The output voltage of the DC power supply 20 is applied directly to the gate terminal G of the carrier amplifier 61.

An example in which when the maximum output power specification of the power amplification device is set to 34 dBm, 28 dBm being −6 dB value of the maximum output power is determined as the given value A, and the given value B is set to −6 dB value (25 dBm) of the saturated power at the time of the low voltage operation is illustrated in FIG. 11. In this case, when the output power is equal to or lower than 28 dBm being the given value A, the low voltage obtained by the conversion by the voltage converter 32 is applied to the drain terminals D of the carrier amplifier 61 and the peak amplifier 64, thereby allowing the carrier amplifier 61 and the peak amplifier 64 to operate at the low voltage. Thus, it is possible to obtain the high drain efficiency in the low output state. Further, when the output power is close to 25 dBm being the given value B, the power consumed by the peak amplifier 64 is reduced, thereby making it possible to improve the drain efficiency in the low output state.

On the other hand, when the output power is larger than 28 dBm being the given value A, the voltage of the DC power supply 10 is applied to the drain terminals D of the carrier amplifier 61 and the peak amplifier 64, thereby allowing the carrier amplifier 61 and the peak amplifier 64 to operate at the high voltage. Thus, it is possible to ensure the highly saturated power in the high output state.

As described above, a lower voltage is applied to the drain terminals D or the collector terminals C of the carrier amplifier 61 and the peak amplifier 64 when the output power is equal to or lower than the given value A, and the gate voltage or the base voltage that allows the peak amplifier 64 to be completely turned off is applied to the Doherty amplifier 60 when the output power is equal to or lower than the given value B. As a result, the power consumed by the peak amplifier 64 can be reduced in the region where the peak amplifier 64 is to be in the off-state in theory, and the operation is conducted at the low voltage, thereby enabling the power efficiency at the time of the smaller signal to be further improved.

Further, the applied voltages to the drain terminals D of the carrier amplifier 61 and the peak amplifier 64 changes over to three steps or more (at least three drain voltages different in voltage value), thereby making it possible to further improve the efficiency. The drain applied voltage can be set to three steps or more, thereby enabling the power efficiency to be further enhanced. To achieve this, it is conceivable to adopt a method in which the voltage converter 32 is of an output voltage variable type and controlled by the voltage control circuit 50, a method in which two or more voltage converters 32 are provided and switched over under the control of the voltage control circuit 50, or the like. That is, the voltage control circuit 50 instructs the voltage converter circuit 30 about a voltage variably output from the voltage converter circuit 30 on the basis of the magnitude relation between two or more given values (at least two given values different in value) and the output power (at least three instructions). The voltage converter circuit 30 outputs at least three drain voltages different in voltage value on the basis of the at least three instructions.

Fifth Embodiment

Figure 12:
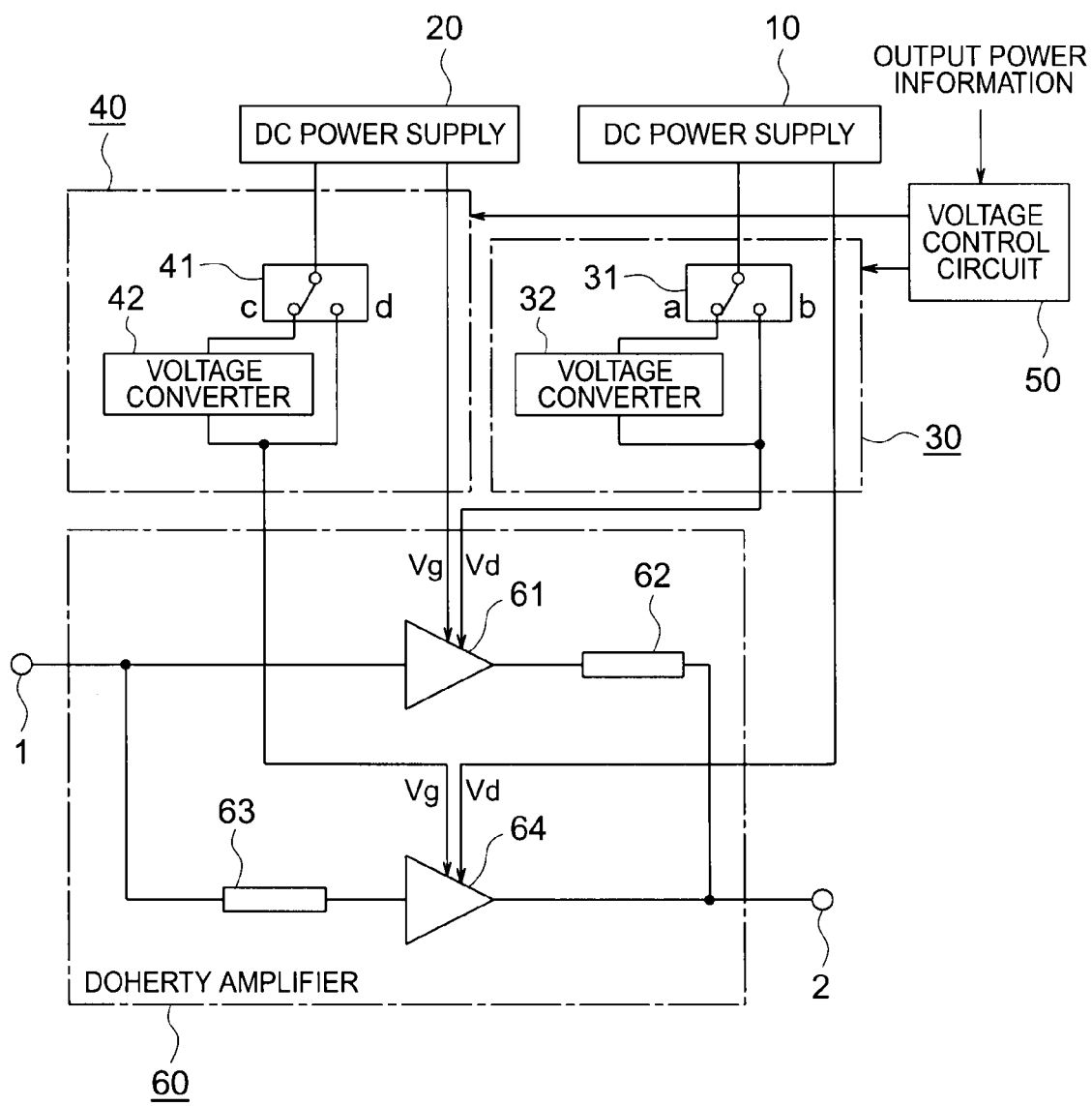
FIG. 12 A diagram illustrating a configuration of a power amplification device according to a fifth embodiment of the present invention.

A power amplification device according to a fifth embodiment of the present invention is described with reference to FIG. 12. FIG. 12 is a diagram illustrating a configuration of the power amplification device according to the fifth embodiment of the present invention.

Referring to FIG. 12, the configuration of the power amplification device according to the fifth embodiment of the present invention is different from that of the fourth embodiment in that the voltage to the drain terminal D of the carrier amplifier 61 changes over between the direction application from the DC power supply 10 and the variable application through the voltage converter 32 therefrom, and the output voltage of the DC power supply 10 is applied directly to the drain terminal D of the peak amplifier 64. Other configurations and operation are identical with those of the fourth embodiment.

Subsequently, a description is given of the operation of the power amplification device according to the fifth embodiment of the present invention with reference to the drawings.

On the basis of the output power information, when the output power is equal to or lower than the given value A, the voltage control circuit 50 connects the switch 31 to the side a. The voltage control circuit 30 converts the output voltage of the DC power supply 10 into the lower voltage by means of the voltage converter 32, and applies the converted voltage to the drain terminal D of the carrier amplifier 61. On the other hand, when the output power is larger than the given value A, the voltage control circuit 50 connects the switch 31 to the side b. The voltage control circuit 30 applies the output voltage of the DC power supply 10 to the drain terminal D of the carrier amplifier 61. The output voltage of the DC power supply 10 is applied directly to the drain terminal D of the peak amplifier 64.

In the power amplification device illustrated in FIG. 12, only the carrier amplifier 61 is made to operate at the low voltage, thereby making it possible to set the current capacity required for the voltage converter 32 to be smaller than (for example, to about half) the maximum current consumption of the Doherty amplifier 60. As a result, there are such advantages that the power consumption and the calorific value in the voltage converter 32 can be reduced, and that downsized and inexpensive parts can be used. The carrier amplifier 61 is made to operate at the low voltage and high voltage. As a result, the power efficiency of the carrier amplifier 61 at the time of the low voltage operation is improved, and a higher saturated power can be obtained by the carrier amplifier 61 and the peak amplifier 64 at the time of the high voltage operation.

Further, the applied voltage to the drain terminal D of the carrier amplifier 61 changes over to three steps or more (at least three drain voltages different in voltage value), thereby making it possible to further improve the efficiency. The drain applied voltage can be set to three steps or more, thereby enabling the power efficiency to be further enhanced. To achieve this, it is conceivable to adopt a method in which the voltage converter 32 is of an output voltage variable type and controlled by the voltage control circuit 50, a method in which two or more voltage converters 32 are provided and switched over under the control of the voltage control circuit 50, or the like. That is, the voltage control circuit 50 instructs the voltage converter circuit 30 about a voltage variably output from the voltage converter circuit 30 on the basis of the magnitude relation between two or more given values (at least two given values different in value) and the output power (at least three instructions). The voltage converter circuit 30 outputs at least three drain voltages different in voltage value on the basis of the at least three instructions.

According to the fifth embodiment of the present invention, the lower voltage is applied to the drain terminals D or the collector terminals C when the output power is lower than the given value A, and the gate voltage or the base voltage that allows the peak amplifier 64 to be completely turned off is applied to the Doherty amplifier 60 when the output power is equal to or lower than the given value B. As a result, the power consumed by the peak amplifier 64 because the peak amplifier 64 is not completely in the off-state in the region where the peak amplifier 64 is to be in the off-state in theory, can be reduced, and the operation is conducted at the low voltage, thereby enabling the power efficiency at the time of the smaller signal to be further improved.

The invention claimed is:

1. A power amplification device, comprising:
   a DC power supply that outputs a first drain voltage;
   a Doherty amplifier including a carrier amplifier and a peak amplifier, which are connected in parallel, and amplifies an RF signal;
   a voltage control circuit that outputs a first instruction to output a low voltage when an output power is equal to or lower than a given value, and outputs a second instruction to output a high voltage when the output power is larger than the given value; and
   a voltage converter circuit that applies a second drain voltage obtained by subjecting the first drain voltage to voltage conversion, or the first drain voltage to drain terminals of the carrier amplifier and the peak amplifier according to the first instruction, and applies the first drain voltage or the second drain voltage obtained by subjecting the first drain voltage to voltage conversion to the drain terminals of the carrier amplifier and the peak amplifier according to the second instruction.

2. A power amplification device according to claim 1, wherein the voltage control circuit outputs at least three instructions based on a magnitude relation between at least two given values and the output power, and
wherein the voltage converter circuit outputs at least three drain voltages according to at least three instructions.

* * * * *